United States Patent
Hishida

(10) Patent No.: US 8,053,666 B2
(45) Date of Patent: *Nov. 8, 2011

(54) SOLAR CELL AND MANUFACTURING METHOD OF THE SOLAR CELL

(75) Inventor: Yuji Hishida, Osaka (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 642 days.

This patent is subject to a terminal disclaimer.

(21) Appl. No.: 12/120,728

(22) Filed: May 15, 2008

(65) Prior Publication Data

US 2009/0314346 A1  Dec. 24, 2009

(30) Foreign Application Priority Data

May 22, 2007 (JP) .................. 2007-135807

(51) Int. Cl.
*H01L 31/0376* (2006.01)
*H01L 31/18* (2006.01)

(52) U.S. Cl. ........ 136/256; 136/258; 136/255; 136/252; 438/96; 438/94; 438/57; 257/53; 257/63; 257/184; 257/200; 257/201; 257/52

(58) Field of Classification Search .................. 136/256, 136/258, 255, 252; 438/96, 94, 57; 257/53, 257/63, 184, 200, 201, 52
See application file for complete search history.

(56) References Cited

U.S. PATENT DOCUMENTS

| | | | | |
|---|---|---|---|---|
| 3,903,427 A | * | 9/1975 | Pack ........................ | 250/208.2 |
| 4,065,742 A | * | 12/1977 | Kendall et al. .................. | 338/9 |
| 4,726,850 A | * | 2/1988 | Wenham et al. .............. | 136/256 |
| 4,748,130 A | * | 5/1988 | Wenham et al. ................ | 438/98 |
| 5,145,793 A | * | 9/1992 | Oohara et al. .................. | 438/94 |
| 5,468,988 A | * | 11/1995 | Glatfelter et al. ............. | 257/431 |
| 5,626,686 A | * | 5/1997 | Yoshida ........................ | 136/244 |
| 6,639,143 B2 | * | 10/2003 | Kim et al. ..................... | 136/256 |
| 6,730,594 B2 | * | 5/2004 | Noguchi et al. .............. | 438/653 |
| 7,170,001 B2 | * | 1/2007 | Gee et al. ...................... | 136/256 |
| 2004/0200520 A1 | | 10/2004 | Mulligan et al. | |
| 2005/0016585 A1 | * | 1/2005 | Munzer ........................ | 136/261 |
| 2007/0157965 A1 | * | 7/2007 | Park .............................. | 136/256 |
| 2007/0235075 A1 | * | 10/2007 | Park .............................. | 136/252 |
| 2008/0276981 A1 | * | 11/2008 | Kinoshita et al. ............. | 136/244 |
| 2009/0126788 A1 | * | 5/2009 | Hishida et al. ................ | 136/256 |

FOREIGN PATENT DOCUMENTS

| | | | |
|---|---|---|---|
| JP | 01-281776 | * | 11/1989 |
| JP | 02-051282 | | 2/1990 |
| JP | 2006-523025 | | 10/2006 |
| WO | WO2007/099955 A1 | * | 9/2007 |

* cited by examiner

*Primary Examiner* — Alexa Neckel
*Assistant Examiner* — Golam Mowla
(74) *Attorney, Agent, or Firm* — Marvin A. Motsenbocker; Mots Law, PLLC

(57) ABSTRACT

A p type amorphous silicon layer is stacked, by a CVD method, on a main surface of an n type single-crystalline silicon substrate; an n type amorphous silicon layer is stacked, by the CVD method, on a surface opposite to the surface on which the p type amorphous silicon layer is stacked; and, by using a laser ablation processing method, through-holes are formed in the n type single-crystalline silicon substrate, the p type amorphous silicon layer, and the n type amorphous silicon layer. Subsequently, an insulating layer is formed on an inner wall surface of each of the through-holes, and then a conductive material is filled therein.

2 Claims, 3 Drawing Sheets

SOLAR CELL AND MANUFACTURING METHOD OF THE SOLAR CELL

CROSS REFERENCE TO RELATED APPLICATIONS

This application is based upon and claims the benefit of priority from the prior Japanese Patent Application No. P 2007-135807, filed on May 22, 2007; the entire contents of which are incorporated herein by reference.

BACKGROUND OF THE INVENTION

1. Field of the Invention

The present invention relates to a solar cell and a manufacturing method of the same. Here, the solar cell includes a p-side electrode and an n-side electrode on its back surface side that is opposite to its light receiving surface side.

2. Description of the Related Art

A solar cell is expected to be an alternative energy source because the solar cell can directly convert sun light, which is an unlimited source of clean energy, into electricity. Such a solar cell has been desired to be thinner because of the need to cut down the manufacturing cost along with expansion of the solar cell market, as well as the need to reduce the amount of silicon use along with shortage in the stock of silicon material. Additionally, the solar cell has been desired to be more efficient in light conversion as well as to be thinner.

Most crystalline silicon solar cells include a single crystalline silicon substrate, on one main surface of which a p type region is formed, and on the other main surface of which an n type region is formed. Collecting electrodes (such as extracting electrodes and line-shaped electrodes) are formed on the p type regions and then type regions, in order to collect current. It is important for the collecting electrodes to enlarge its cross-sectional area, in order to improve conductivity and thus to reduce resistance loss. In addition, it is also important to reduce so-called shadow loss, which is caused by the presence of these collecting electrodes blocking an incident light.

Accordingly, as a way to satisfy these demands, a so-called back contact solar cell has been proposed. In this solar cell, p-doped regions and n-doped regions are alternately disposed on its back surface side that is opposite to its light receiving side. The collecting electrodes are also formed on the back surface (see Japanese Patent Translation Publication No. 2006-523025).

Moreover, there has been proposed a way to satisfy the demands, in which a current is extracted from a back surface side of a substrate with the following structure. The substrate provided with a through-hole includes a doped layer formed on its light receiving surface side, the doped layer extending continuously on the light receiving surface side and on a periphery of the through-hole on the back surface side through the inner wall surface of the through-hole (see Japanese Unexamined Patent Application Publication No. Hei 2-51282).

Furthermore, as an example of a solar cell capable of achieving both thinness and high efficiency, there has been known a solar cell including a so-called HIT (Heterojunction with Intrinsic Thin-layer) structure. In the HIT structure, a substantially intrinsic amorphous silicon layer is sandwiched between a single-crystalline silicon substrate and an amorphous silicon layer, so that defects at the interface are reduced, thereby improving characteristics of a heterojunction at the interface. The solar cell with the HIT structure is capable of achieving both thinness and high efficiency, as compared with a crystalline silicon solar cell. Meanwhile, since such a solar cell with the HIT structure includes a front-to-back symmetric structure, a collecting electrode is formed also on a light receiving surface side. Accordingly, further high efficiency is expected to be achieved in such a solar cell with the HIT structure, by reducing shadow loss with the collecting electrode.

In the solar cell with the HIT structure, an i type amorphous silicon layer and a p type amorphous silicon layer are sequentially stacked, by the CVD method, on a light receiving surface of an n type single-crystalline silicon wafer. Additionally, in the solar cell with the HIT structure, an i type amorphous silicon layer and an n type amorphous silicon layer are sequentially stacked, by the CVD method, on a back surface side of the n type single-crystalline silicon wafer.

SUMMARY OF THE INVENTION

A solar cell according to an aspect of the present invention is mainly characterized by including: a semiconductor substrate; a first amorphous semiconductor layer of a first conductivity type, the layer formed on a first main surface of the semiconductor substrate; a second amorphous semiconductor layer of a second conductivity type, the layer formed on a second main surface of the semiconductor substrate; a plurality of through-holes which penetrate the first amorphous semiconductor layer, the semiconductor substrate, and the second amorphous semiconductor layer; an insulating layer which is formed continuously on an inner wall of each of the plurality of through-holes and on the second amorphous semiconductor layer; a plurality of line-shaped electrodes which are formed on a surface of the first amorphous semiconductor layer; a plurality of conductive layers which are formed in each of the plurality of through-holes, and which are electrically connected to each of the plurality of line-shaped electrodes; a first extracting electrode which is formed on the second amorphous semiconductor layer with the insulating layer in between, and which is electrically connected to the plurality of conductive layers; and a second extracting electrode which is formed on the second amorphous semiconductor layer.

In a manufacturing method of a solar cell according to an aspect of the present invention, the solar cell to be manufactured includes a semiconductor substrate having a first main surface and a second main surface that is provided opposite to the first main surface. The manufacturing method is mainly characterized by including the steps of: (A) forming a first amorphous semiconductor layer of a first conductivity type, on the first main surface of the semiconductor substrate; (B) forming a second amorphous semiconductor layer of a second conductivity type, on the second main surface of the semiconductor substrate; (C) forming a plurality of through-holes that penetrate the first amorphous semiconductor layer, the semiconductor substrate, and the second amorphous semiconductor layer; (D) forming an insulating layer extending continuously on an inner wall of each of the plurality of through-holes and on the second amorphous semiconductor layer; (E) forming a plurality of line-shaped electrodes on the first amorphous semiconductor layer; (F) forming a plurality of conductive layer in each of the plurality of through-holes; (G) forming a first extracting electrode on the second amorphous semiconductor layer with the insulating layer in between; and (H) forming a second extracting electrode on a surface of the second amorphous semiconductor layer. In the step (F), the plurality of conductive layers are electrically connected to each of the plurality of line-shaped electrodes.

In the step (G), the first extracting electrode is electrically connected to the plurality of conductive layers.

DETAILED DESCRIPTION OF THE EMBODIMENTS

Figure 1:
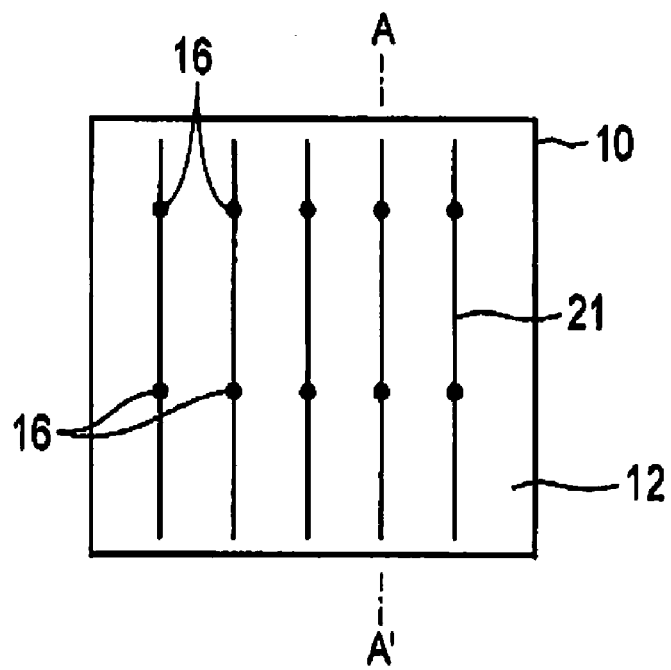
FIG. 1 is a plane view showing a solar cell according to an embodiment of the present invention, as viewed from its light receiving surface side.

Next, a description of an embodiment of the present invention will be given with reference to the drawings. In the description of the drawings below, the same or similar parts are represented by the same or similar reference numerals. However, it should be noted that the drawings are schematic, and the ratio or the like of each dimension is different from an actual one. Therefore, specific dimensions and the like should be judged in consideration of the following description. In addition, parts, whose relations and ratios of the dimensions are different from each other between the drawings, are naturally included.

(Configuration of Solar Cell)

With respect to a configuration of a solar cell according to the embodiment of the present invention, a description will be given with reference to FIGS. 1 to 3.

FIG. 1 is a plane view showing a solar cell 1, as viewed from its light receiving surface side. FIG. 2 is a plane view showing the solar cell 1, as viewed from its back surface side. FIG. 3 is a cross-sectional view taken along the line A-A' of FIG. 2.

Figure 3:
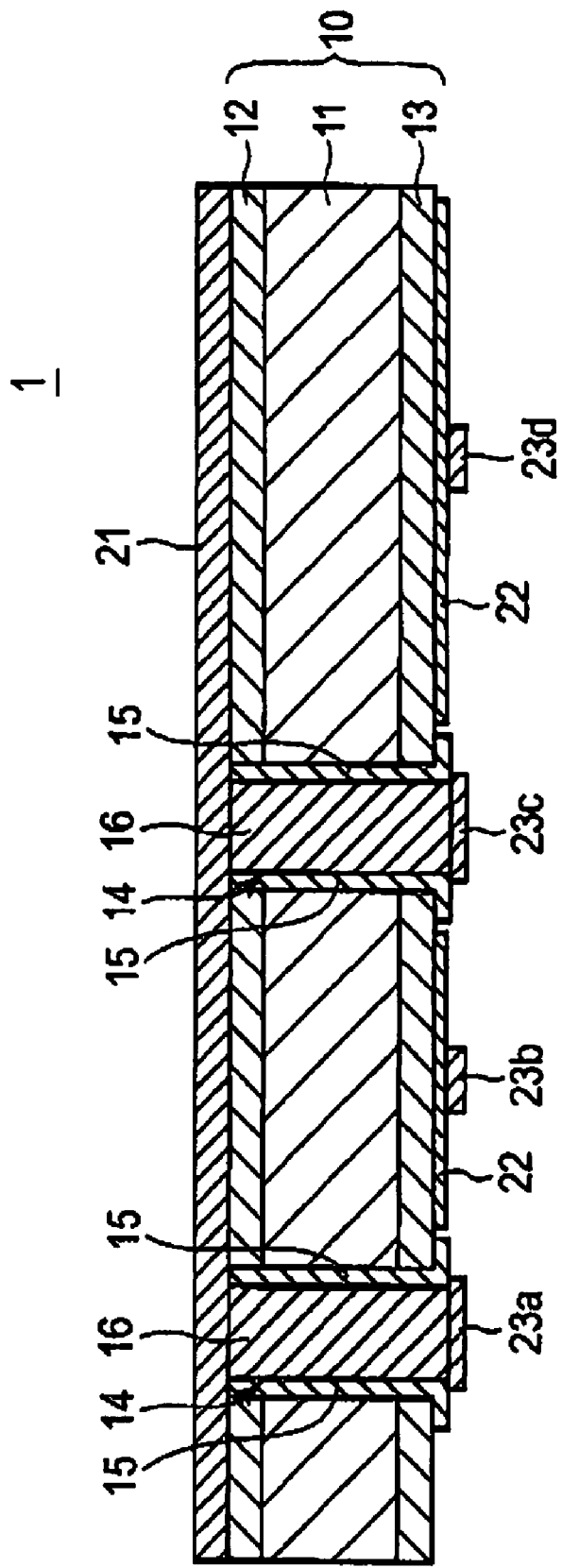
FIG. 3 is a cross-sectional view taken along the line A-A' of FIG. 2.

The solar cell 1 includes a photoelectric conversion body 10 that is composed of: an n type single-crystalline silicon substrate 11; and a p type amorphous silicon layer 12 that is formed on a light receiving surface of the n type single-crystalline silicon substrate 11; and an n type amorphous silicon layer 13 that is formed on a back surface of the n type single-crystalline silicon substrate 11 (see FIG. 3). Note that, although not illustrated, the solar cell 1 has a so-called HIT structure. In the HIT structure, a substantially intrinsic amorphous silicon layer is sandwiched between the n type single-crystalline silicon substrate 11 and the p type amorphous silicon layer 12, as well as between the n type single-crystalline silicon substrate 11 and the n type amorphous silicon layer 13. Thus, defects at each interface are reduced, so that characteristics of a heterojunction at the interface are improved. Then type single-crystalline silicon substrate 11 may be mainly composed of polycrystalline silicon.

A p-n junction is formed at the interface between the n type single-crystalline silicon substrate 11 and the p type amorphous silicon layer 12. In addition, a BSF (Back Surface Field) structure is formed at the interface between the n type single-crystalline silicon substrate 11 and the n type amorphous silicon layer 13.

As shown in FIG. 3, multiple through-holes 14 are provided in the photoelectric conversion body 10. The multiple through-holes 14 penetrate the p type amorphous silicon layer 12, the n type single-crystalline silicon substrate 11, and the n type amorphous silicon layer 13. Each of the multiple through-holes 14 is provided at a predetermined position on a line-shaped electrode 21 that is formed on a light receiving surface of the photoelectric conversion body 10 (see FIGS. 1 and 3). An insulating layer 15 is formed on an inner wall surface of each of the multiple through-holes 14. Additionally, a conductive material 16 is filled in each of the multiple through-holes 14 through the insulating layer 15. The conductive material 16, as shown in FIG. 1, is electrically connected to the line-shaped electrode 21 so as to play the role of passing a current, collected on the light receiving surface side of the photoelectric conversion body 10, through the back surface side.

In order to form the multiple through-holes 14, various methods can be employed such as: a wet etching method using fluorine nitric acid and an alkaline solution; a dry etching method using gases of $Cl_2$, $CF_4$, $BCl_3$, and the like; and a laser ablation processing method. The laser ablation processing method can be preferably employed, because it is not necessary to form a resist pattern on the n type single-crystalline silicon substrate 11.

With respect to the laser ablation processing method, a laser having an output exceeding 1 $J/cm^2$ can be used. For example, Nd:YAG laser (fundamental wave, second harmonic wave, and third harmonic wave) as well as XeCl excimer laser, KrF excimer laser, ArF excimer laser, and the like can be used.

In order to improve a current collection efficiency, a transparent conductive film (not illustrated) and the line-shaped electrode 21 are formed on the p type amorphous silicon layer 12 of the photoelectric conversion body 10. In this embodiment, there is no extracting electrode on the light receiving surface, and the current collected by the line-shaped electrode 21 is led to the back surface side of the photoelectric conversion body 10 by the conductive material 16. In FIG. 1, to simplify the illustration, only 5 lines of the line-shaped electrodes 21 are shown. However, many lines of the line-shaped electrodes 21 are usually formed all over the surface of the solar cell 1. The line-shaped electrodes 21 are, for example, formed by a process in which silver paste is screen-printed and cured at a temperature of a hundred and several tens degrees.

Figure 2:
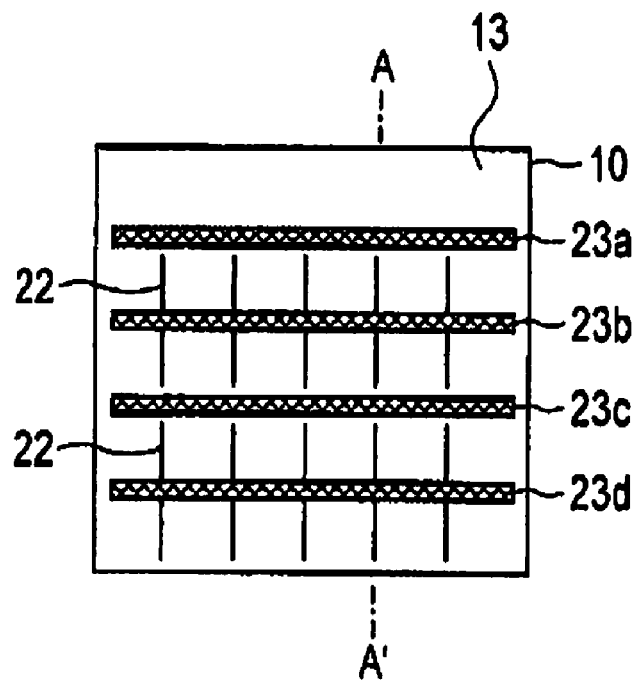
FIG. 2 is a plane view showing the solar cell according to the embodiment of the present invention, as viewed from its back surface side.

In addition, as shown in FIG. 2, a transparent conductive film (not illustrated) and collecting electrodes are formed also on the back surface of the photoelectric conversion body 10. The collecting electrodes on the back surface side include: line-shaped electrodes 22; and extracting electrodes 23 that are connected to the line-shaped electrodes 22. In FIG. 2 as viewed from the back surface of the solar cell 1, to simplify the illustration, only 10 lines of the line-shaped electrodes 22 are shown. However, many lines of the line-shaped electrodes 22 are usually formed all over the back surface of the solar cell 1. The line-shaped electrodes 22 are, for example, formed by a process in which silver paste is screen-printed and cured at a temperature of a hundred and several tens degrees. Note that on the back surface side of the solar cell 1, the number of the line-shaped electrodes 22 can be made larger than the number of the line-shaped electrodes 21, since it is not necessary to consider the reduction in the light receiving area on the back surface side.

Additionally, as shown in FIG. 2, extracting electrodes 23a, 23b, 23c, and 23d are formed on the back surface of the photoelectric conversion body 10. As shown in FIG. 3, each of the extracting electrodes 23a and 23c is connected to the conductive material 16 on the back surface side of the photoelectric conversion body 10. The current collected by the line-shaped electrodes 21 is led, through the conductive material 16, to each of the extracting electrodes 23a and 23c. The extracting electrodes 23b and 23d are connected respectively to the line-shaped electrodes 22. Note that the insulating layer 15 is formed, between the back surface of the photoelectric conversion body 10 and each of the extracting electrodes 23a and 23c, along each of the extracting electrodes 23a and 23c.

The solar cell 1 of this embodiment has the above-mentioned configuration. As a result, when each conductive material 16 is connected to the extracting electrodes 23a and 23c, the current collected by the line-shaped electrode 21 can be collected on the back surface of the photoelectric conversion body 10. With this configuration, when a solar cell module is manufactured by using the solar cells 1, wiring members for connecting the solar cells 1 to each other can be provided only to the back surface side. Thus, it is possible to provide a configuration, for collecting the current generated by the photoelectric conversion body 10 on the back surface side, to the solar cell with the HIT structure.

In addition, if a solar cell module is manufactured by using the solar cell 1, blockage of light due to the wiring members provided on the light receiving surface side, can be eliminated. Thus, the light receiving area of the solar cell 1 is increased. With this configuration, conversion efficiency of the solar cell 1 with the HIT structure can be further improved.

(Manufacturing Method of the Solar Cell)

Next, a manufacturing method of the solar cell 1 according to an embodiment of the present invention will be described with reference to the FIGS. 4A to 4E.

Figure 4A:
FIGS. 4A to 4E are explanatory diagrams for explaining a manufacturing method of a solar cell according to an embodiment of the present invention.
Figure 4B:
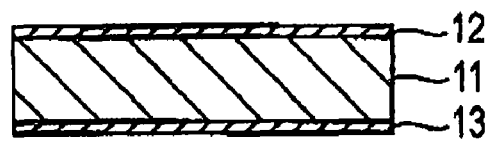

As shown in FIG. 4A, the p type amorphous silicon layer 12 is stacked, by the CVD method, on one main surface of the n type single-crystalline silicon substrate 11. Then, the n type amorphous silicon layer 13 is stacked, by the CVD method, on the other main surface of the n type single-crystalline silicon substrate 11 (FIG. 4B). Thereafter, transparent conductive films (not illustrated) are respectively formed on the p type amorphous silicon layer 12 and the n type amorphous silicon layer 13 so that the photoelectric conversion body 10 can be manufactured.

Figure 4C:
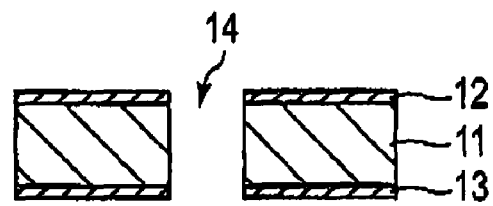

After that, the multiple through-holes 14 are formed, by the laser ablation processing method or the like, in the photoelectric conversion body 10 (FIG. 4C).

Figure 4D:
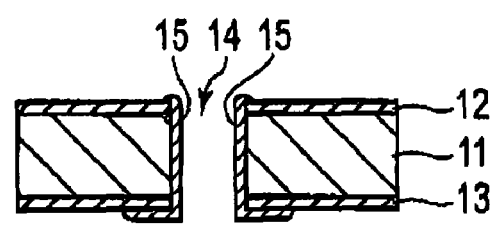

Subsequently, the insulating layer 15 is formed, from the inner wall surface of each of the multiple through-holes 14 formed in the photoelectric conversion body 10, to a periphery of the opening provided in the back surface of the photoelectric conversion body 10 (FIG. 4D). In other words, the insulating layer 15 is formed on a sufficiently enough area at the periphery of the opening on the back surface of the photoelectric conversion body 10 such that the conductive material 16, which is filled in the subsequent step, does not come into contact with the back surface of the photoelectric conversion body 10, Note that the insulating layer 15 is formed, on the back surface of the photoelectric conversion body 10, in a predetermined direction.

Figure 4E:
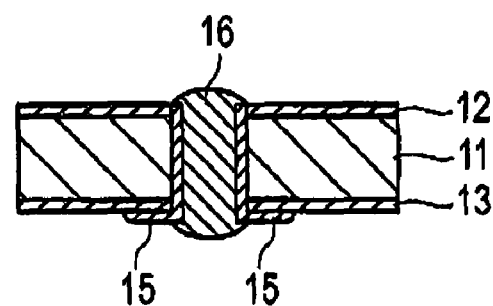

Thereafter, the conductive material 16 is filled in each of the multiple through-holes 14 (FIG. 4E). The inner wall surface of each of the through-holes 14 and the conductive material 16 are insulated from each other by the insulating layer 15. Hence, it is possible to securely lead the current collected on the light receiving surface side of the solar cell 1 to the back surface side, according to each of the through-holes 14 and the conductive material 16 that is formed therein through the insulating layer is.

As described with reference to FIGS. 4A to 4E, the manufacturing method of the solar cell 1 according to this embodiment has the following steps. First, the p type amorphous silicon layer 12 is stacked, by the CVD method, on the light receiving surface of the n type single-crystalline silicon substrate 11. Next, the n type amorphous silicon layer 13 is stacked, by the CVD method, so as to form the photoelectric conversion body 10. Then, the transparent conductive films are respectively formed on both the front and back surfaces of the resultant substrate. Thereafter, the multiple through-holes 14 are formed so as to penetrate all of the p type amorphous silicon layer 12, the n type single-crystalline silicon substrate 11, the n type amorphous silicon layer 13, and the transparent conductive films on the front and back surfaces.

Accordingly, it is possible to solve the problem that occurs when an amorphous silicon layer is formed, by the CVD method, on one main surface (or the other main surface) of a substrate, after through-holes are firstly provided in the substrate. In other words, it is possible to solve the problem that an amorphous silicon layer forming the light receiving surface (or the back surface) is unnecessarily deposited at the periphery of the opening of each of the through-holes 14 on the back surface (or the light receiving surface). Thus, an undesirable amorphous silicon layer formed in the peripheries of the through-holes 14 can be prevented from adversely affecting solar cell characteristics. Moreover, it is possible to securely lead the current collected on the light receiving surface side of the photoelectric conversion body 10 to the back surface side, because the inner wall of each of the through-holes 14 and the conductive material 16 are securely insulated from each other by the insulating layer 15.

According to the above-mentioned manufacturing method of the solar cell 1, a configuration in which the currents collected on both the light receiving surface side and back surface side of the photoelectric conversion body 10 are collected on the back surface side, can be provided to the solar cell with the HIT structure. In addition, if a solar cell module is manufactured by using the solar cell 1, blockage of light due to the wiring members provided on the light receiving surface side, can be eliminated. Thus, it is possible to increase the effective area for receiving light on the solar cell 1. With this configuration, conversion efficiency of the solar cell 1 with the HIT structure can be further improved.

It should be noted that the n type single-crystalline silicon substrate 11 is used as an example for the description of the above-mentioned embodiment; however, a substrate made of different semiconductor materials such as polycrystalline silicon and GaAs may be used, instead of single crystalline silicon. Additionally, with regard to a conductivity type of the semiconductor substrate, either of n type or p type may be used. Moreover, it is possible to adopt a configuration having a p-n junction and the BSF junction, respectively, on the back surface side and on the light receiving surface side of the substrate.

The present invention can be modified variously without departing from the gist of the present invention as described above, and the description and drawings constituting a part of this disclosure do not limit the present invention.

What is claimed is:

1. A solar cell comprising:
a semiconductor substrate;
a first amorphous semiconductor layer of a first conductivity type, the layer formed on a first main surface of the semiconductor substrate;
a second amorphous semiconductor layer of a second conductivity type, the layer formed on a second main surface of the semiconductor substrate;
a plurality of through-holes which penetrate the first amorphous semiconductor layer, the semiconductor substrate, and the second amorphous semiconductor layer;

an insulating layer which is formed continuously on an inner wall of each of the plurality of through-holes and on the second amorphous semiconductor layer;

a plurality of line-shaped electrodes which are formed on a surface of the first amorphous semiconductor layer;

a plurality of conductive layers which are formed in each of the plurality of through-holes, and which are electrically connected to one or more of the plurality of line-shaped electrodes;

a first extracting electrode which is formed on the second amorphous semiconductor layer with the insulating layer in between, and which is electrically connected to the plurality of conductive layers; and a second extracting electrode which is formed on the second amorphous semiconductor layer.

2. A manufacturing method of a solar cell including a semiconductor substrate having a first main surface and a second main surface that is provided opposite to the first main surface, the manufacturing method comprising the steps of:

(A) forming a first amorphous semiconductor layer of a first conductivity type, on the first main surface of the semiconductor substrate;

(B) forming a second amorphous semiconductor layer of a second conductivity type, on the second main surface of the semiconductor substrate;

(C) forming a plurality of through-holes penetrating the first amorphous semiconductor layer, the semiconductor substrate, and the second amorphous semiconductor layer;

(D) forming an insulating layer extending continuously on an inner wall of each of the plurality of through-holes and on the second amorphous semiconductor layer;

(E) forming a plurality of line-shaped electrodes on the first amorphous semiconductor layer;

(F) forming a plurality of conductive layers in each of the plurality of through-holes;

(G) forming a first extracting electrode on the second amorphous semiconductor layer with the insulating layer in between; and (H) forming a second extracting electrode on a surface of the second amorphous semiconductor layer, wherein the plurality of conductive layers are electrically connected to one or more of the plurality of line-shaped electrodes in the step (F), and the first extracting electrode is electrically connected to the plurality of conductive layers in the step (G).

* * * * *